(12) United States Patent
Pakulski et al.

(10) Patent No.: US 6,551,936 B2
(45) Date of Patent: Apr. 22, 2003

(54) METHOD OF ETCHING PATTERNS INTO EPITAXIAL MATERIAL

(75) Inventors: Grzegorz J. Pakulski, Woodlawn (CA); Richard J. Finlay, Ottawa (CA)

(73) Assignee: Bookham Technology plc, Abingdon (GB)

( * ) Notice: Subject to any disclaimer, the term of this patent is extended or adjusted under 35 U.S.C. 154(b) by 87 days.

(21) Appl. No.: 09/750,124

(22) Filed: Dec. 29, 2000

(65) Prior Publication Data

US 2002/0086550 A1 Jul. 4, 2002

(51) Int. Cl.$^7$ ............................................. H01L 21/311
(52) U.S. Cl. ....................... 438/694; 438/745; 438/752; 438/753
(58) Field of Search ......................... 438/32, 694, 702, 438/542, 745, 752, 753; 372/102; 216/19, 76, 101

(56) References Cited

U.S. PATENT DOCUMENTS

| | | | |
|---|---|---|---|
| 4,595,454 A | * 6/1986 | Dautremont-Smith et al. ... | 252/79.2 |
| 4,792,197 A | * 12/1988 | Inoue et al. ................... | 350/3.7 |
| 4,929,571 A | * 5/1990 | Omura et al. ................ | 437/129 |
| 5,567,659 A | 10/1996 | Pakulski et al. ............ | 437/228 |

FOREIGN PATENT DOCUMENTS

| | | | | |
|---|---|---|---|---|
| JP | 55141774 | * | 11/1980 | ............. H01S/3/18 |
| JP | 360015985 A | * | 1/1985 | ............. H01S/3/18 |

* cited by examiner

Primary Examiner—Robert Kunemund
Assistant Examiner—Duy-Vu Deo
(74) Attorney, Agent, or Firm—Lahive & Cockfield, LLP

(57) ABSTRACT

An improved method for etching a pattern in a semiconductor material is based on the formation of an InP grating mask on the semiconductor material. The formation of the InP grating mask involves the formation of a multi-layered structure on the semiconductor material with an etch-stop layer between two InP layers. A photoresist grating mask corresponding to the pattern to be etched in the semiconductor material is then formed on the top InP layer. Subsequently, a non-selective etch is used to penetrate the top InP layer, the etch-stop layer, and the lower InP layer. A suitable stripping solvent is then used to remove the photoresist followed by a selective etch to clear the remaining exposed InP material, remove contaminated material and to expose the underlying semiconductor material in accordance with the pattern to be etched. Additional masking beyond the InP mask is, therefore, not required. The exposed semiconductor material is then etched such that the pattern is transferred to the semiconductor material.

25 Claims, 3 Drawing Sheets

METHOD OF ETCHING PATTERNS INTO EPITAXIAL MATERIAL

FIELD OF THE INVENTION

This invention relates to a method of etching semiconductor materials and, more particularly, to an improved method of etching grating patterns into epitaxial material.

BACKGROUND OF THE INVENTION

In order to reduce signal distortion in optical communications systems due to the different propagation rates of different frequencies, sources capable of emitting single-frequency signals are of primary interest. This condition is imperative in the case of high-speed direct source modulation and for use in coherent communications systems.

Semiconductor lasers in which optical feedback is obtained by mechanisms other than multiple reflections between the mirrors delimiting a laser cavity are common examples of sources meeting the above requirement. In these lasers, a selection of the oscillation modes is obtained without resorting to external components so that the laser can be fabricated by conventional integrated-optics circuit technology. Moreover, owing to the absence of the end mirrors, the devices are suitable for integration with other components of an optical communications system.

As a result, semiconductor lasers play a crucial role as light sources for optical communication systems. By selecting appropriate semiconductor materials, conventionally III–V alloy compounds, lasers emitting in the 0.8–1.7 um wavelength range may be fabricated. At present, long haul optical fiber communications is based on operating wavelengths near 1.55 um and 1.3 um; the wavelengths at which single mode optical fibers have minimum attenuation and dispersion, respectively. Lasers have advantages over light emitting diodes (LEDs) of providing a coherent, narrow bandwidth source, ideally suited for communications applications. Single-mode, narrow linewidth light sources for optical communication are thus dominated by laser diodes fabricated from direct band gap, III–V semiconductor alloy materials, particularly InP/InGaAsP, which emit in this particular wavelength region. Shorter wavelength sources, e.g. GaAs/AlGaAs which emit light near 0.9 um, have traditionally been used for short distance transmission.

A semiconductor laser is ordinarily made of Group III–V semiconductor materials because the conditions for stimulated emission are easily obtained in these materials by suitable pump means. One particularly useful form of such a laser has distributed feedback (DFB) i.e. optical feedback is built into the laser cavity along its cavity length. Such feedback is supplied by means of a corrugated DFB waveguide grating. The grating lines run perpendicular to the propagation axis of the laser cavity.

Corrugated waveguide gratings are, in general, key elements in many optical components e.g. filters, distributed feedback (DFB) lasers, and distributed Bragg reflector (DBR) lasers. Such components will continue to play a significant role in future lightwave communication systems. As such, the fabrication of corrugated waveguide gratings continues to be a subject of great interest.

Advanced techniques of epitaxially growing semiconductor materials, for example, metal organic chemical vapor deposition (MOCVD), has led to the development of new active device structures such as multilayer configurations incorporating multi-quantum-wells and asymmetrical confinement layers. These developments have, in turn, resulted in the realization of surface or buried corrugated waveguide gratings in Distributed Feedback (DFB) or Distributed Bragg Reflector (DBR) lasers.

Optoelectronic devices with regular corrugation or gratings often require precise control of the corrugation or grating. In many DFB or DBR lasers, for example, the corrugation or grating must be etched into the epitaxial structure to produce a periodic modulation of the index of refraction of the laser cavity. A special case of a DFB or DBR laser is a laser with a gain-coupled grating. A gain-coupled grating penetrates the quantum wells in a multiple quantum well, or single quantum well, structure. In all cases, the etching of the corrugation or grating must be very well controlled to accurately determine the electrical and optical properties of the device, including, but not limited to, the mode stability, the lasing efficiency, the optical loss, the optical confinement, the modulation speed, the local current density and the heat conductivity.

The most common procedure for forming gratings in III–IV materials begins with patterning photoresist. The two most common ways to expose the photoresist are patterning by exposure to an interference pattern (such as a hologram) and patterning with electron-beam lithography. The pattern can be transferred from the photoresist to the III–IV material by etching in a wet chemistry. For example, InP-based materials can be etched with a solution of hydrobromic (HBr) and nitric acid ($HNO_3$), or with a solution of iodic acid, though many other chemistries are also known. Another way to transfer the pattern is reactive ion etching (RIE). A major drawback of RIE is that it can cause damage to the crystalline structure which, if in the vicinity of the active region of the device, can be catastrophic. For this reason, in many applications specific to DFB and DBR lasers, wet etching is the preferred means of transferring the corrugation of grating pattern from the photoresist to the III–IV material.

With conventional etching techniques and processes, the grating pattern must be etched through materials with differing compositions and hence, different etch rates. For example, for many wet etch chemistries, quaternary (Q) material with Ga and As etches more quickly than pure InP. Semiconductor laser structures usually have the Ga and As containing layers beneath the InP layers to achieve the needed waveguiding. This means that a gain-coupled grating must be etched through the slow etch rate material into high etch rate material, leading to very poor depth control. To see why this leads to poor depth control, consider a grating tooth that gets slightly ahead of its neighbors while etching the InP. It will reach the quaternary first and could etch through many quantum wells before its neighbor even begins to attack the quaternary. If the target grating depth is deep in the active region, the neighboring grating teeth have a chance to catch up. However, if the target depth is near the top of the active region, very poor depth uniformity will be the result. Changes to etch conditions (concentration, choice of acids etc.) has not proven to greatly improve grating uniformity to date.

In many current DFB and DBR laser designs, weak gain-coupling is appropriate, therefore requiring a grating that penetrates only part-way into the active region. In such cases, the known art of direct wet etching, as described, results in poor depth control. Furthermore, with conventional etching techniques using a photoresist mask, the final etched grating is exposed to the photoresist and corresponding stripping solvent. This is particularly of concern for gain-coupled gratings, where the solvent may introduce contaminants directly into the active region of the device.

SUMMARY OF THE INVENTION

The present invention discloses an improved method of etching gratings for distributed feedback lasers. The method, however, could be applied more generally to etching other patterns into epitaxial material. The present invention uses an InP grating mask as a mask during grating etching. An epitaxial structure and process is described that allows the InP grating mask to be created from a pattern in photoresist. Furthermore, the process removes any InP that was in contact with contaminants like photoresist prior to final etching. The pattern in the InP grating mask is then transferred into underlying epitaxial material. Advantageously, the method of the present invention does not require exposing the final etched structure to solvents or other contaminants such as photoresist stripping solutions.

According to a broad aspect of the invention, then, there is provided a method for etching a pattern in a semiconductor material. The process begins with the formation of an InP grating mask on the semiconductor material, the InP grating mask selectively exposing the semiconductor material and defining the pattern to be etched. The exposed semiconductor material is then etched such that the pattern is transferred to the semiconductor material.

According to another broad aspect of the invention there is provided a method for etching a pattern in a semiconductor material as described above whereby the formation of the InP grating mask on the semiconductor material to be etched involves the design of a structure with an etch-stop layer between two InP layers. A photoresist grating mask corresponding to the pattern to be etched is formed on the top InP layer. A non-selective etch is then used to penetrate the top InP layer, the etch-stop layer, and the lower InP layer. A suitable stripping solvent is used to remove the photoresist followed by a selective etch which is used to clear the remaining exposed InP material, remove contaminated material and selectively expose the underlying semiconductor material in accordance with the pattern to be etched. Additional masking beyond the InP mask in not required.

The method of the present invention is based on removing the slow etch-rate material before etching into the high etch-rate material. This results in greatly improved uniformity, and greatly improved depth control. In the InP masking process of the invention, the solvents are applied during preparation of the InP grating mask; they are not applied after exposing the active region of the device.

The present invention, therefore, improves the yield of gain-coupled gratings in the fabrication of gain-coupled distributed feedback lasers. Advantageously, the invention may be applied to the fabrication of either buried heterojunction lasers or ridge waveguide lasers, two general categories of laser which are both important components of current optical communication systems.

Other aspects and features of the present invention will become apparent to those ordinarily skilled in the art upon review of the following description of specific embodiments of the invention in conjunction with the accompanying drawings.

DESCRIPTION OF THE PREFERRED EMBODIMENTS

In the method of the present invention, the grating is defined in two stages. First, an InP grating mask is defined. Next, the InP grating mask is used as a mask for an etch into the active region of the device. This second etching stage will, from hereon, be referred to as the "blitz etch". The grating is etched through as many quantum wells as necessary to achieve the required magnitude of gain-coupling.

Figure 1:
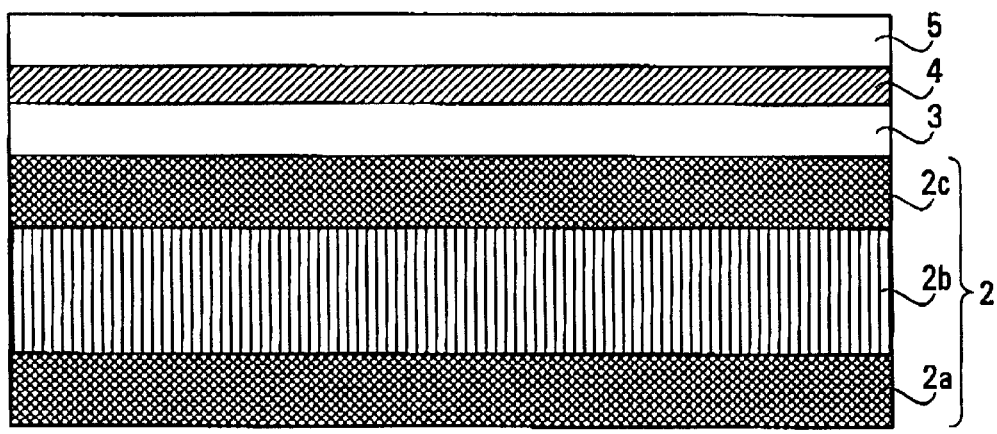
FIG. 1 is a cross-sectional view of a semiconductor material to be etched in accordance with the invention including the multi-layered structure used to form an InP grating mask.

FIG. 1 is a cross-sectional view of a III–V semiconductor structure 2 to be etched in accordance with the present invention. In this structure, an active region 2b is nestled between first and second quaternary stack guiding regions 2a and 2c, respectively. A quaternary stack guiding region typically comprises multiple layers of quaternary alloys having different compositional values (e.g. 1.10 Q, 1.55 Q and 1.20 Q layers). In the particular embodiment that will be described, the quaternary layers are assumed to be InGaAsP, for example. The corrugation or grating pattern is to be formed in the active region 2b. The structure in FIG. 1 is intended as an example only and is not intended to limit the scope of the invention. Other configurations, including bulk active regions and structures without quaternary stack guiding regions are contemplated by the invention.

Referring to FIG. 1, three additional layers have been shown to be added to the second quaternary stack guiding region 2c. Firstly, a lower InP layer 3 is grown on top of the quaternary stacked guiding region 2c. An etch-stop layer 4 is then grown on top of the lower InP layer 3. Finally, an upper InP layer 5 is grown on top of the etch-stop layer 4 to complete the structure. The three layers 3, 4 and 5 are specifically used in the method of the present invention to define an InP grating mask as will be described below. The three layers 3, 4 and 5 may be grown using any suitable epitaxial growth technique known in the art. For example, in addition to MOCVD, other techniques such as molecular beam epitaxy (MBE), chemical beam epitaxy (CBE) or liquid phase epitaxy (LPE) may be used.

In the embodiment of the present invention, the etch-stop layer 4 may, for example, be assumed to be 1.25 Q InGaAsP. As is well known in the art, this means that when excited, the material will emit radiation of maximum intensity at 1.25 μm. The etch-stop layer 4 could also have a lower or higher value for its photoluminescence (PL) wavelength such as 1.20 Q or 1.40 Q or any other wavelength achievable in the InGaAsP material system. In addition, the etch-stop layer may alternatively comprise a strained alloy. In principle, the etch-stop may also be a different kind of material. The key, as will be seen shortly, is that the etch-stop layer 4 needs to resist etching in whatever etchant is used to be remove the upper InP layer 5. The active region 2b usually comprises a series of stacked quantum wells and barriers. Alternatively, the active region 2b may be uniform i.e. comprise a slab of single Q material. As is known, photoemission will be from the slab of single Q material in such cases, instead of from quantum wells within the active region.

Figure 2:
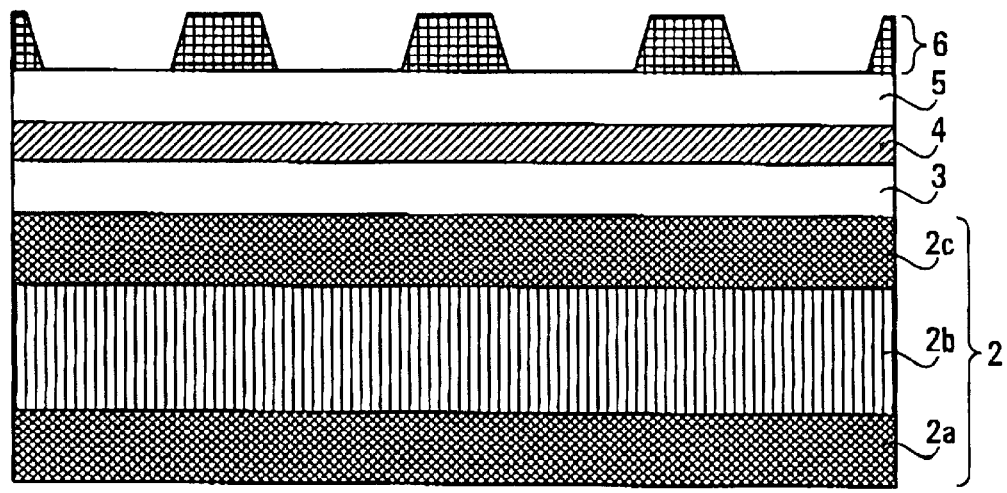
FIG. 2 depicts the structure of FIG. 1 with a photoresist grating mask on the multi-layered structure defining the pattern to be etched into the semiconductor material.

Conventional means are then used to create a photoresist grating mask 6 on the upper InP layer 5 as shown in FIG. 2. Those skilled in the art will appreciate that any other suitable lithography process may be used to create the photoresist grating mask 6 on the upper InP layer 5 including e-beam lithography, stamping and nano-imprint lithography. The structure presented in FIG. 2 is used for illustrative purposes and is only an example embodiment of a structure which may be etched in accordance with the method of the present invention.

Figure 3:
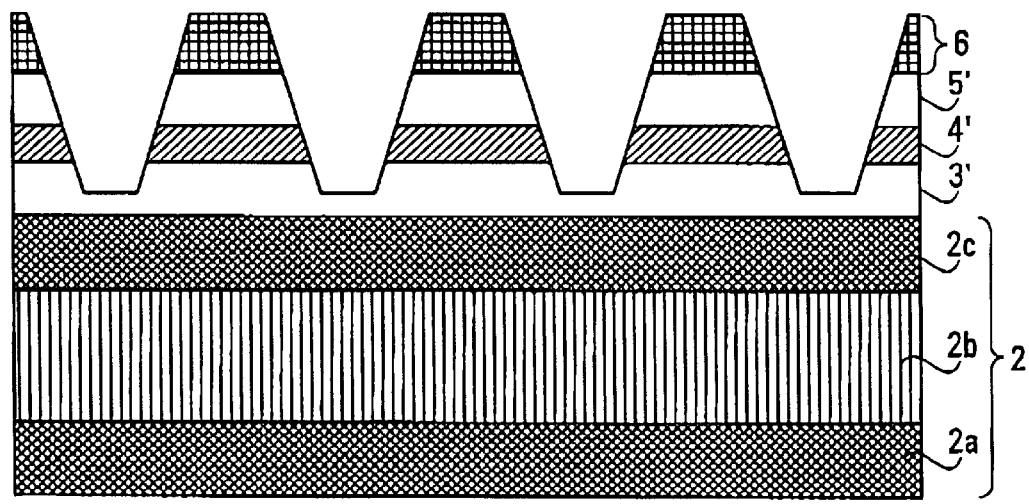
FIG. 3 shows the structure of FIG. 2 after a non-selective etch is used to penetrate the multi-layered structure according to the pattern defined by the photoresist grating mask.

The structure in FIG. 2 is then etched non-selectively, to yield the structure shown in FIG. 3. In this specific embodiment, the etch is stopped when the grating has reached the approximate middle of the lower InP layer 3. Preferably, the etchant is temperature-controlled iodic acid because it readily allows for etch-rate control. However, many other etchants are also suitable. For example, a solution of $HBr:HNO_3:H_2O$ with the constituents in various possible ratios could alternatively be used as the non-selective etchant for this step. Whatever the case, for the particular feature size and acids cited in this example embodiment, the etch should be stopped before its natural crystallographic termination. However, for applications involving the etching of larger features, this may not be an absolute requirement.

Figure 4:
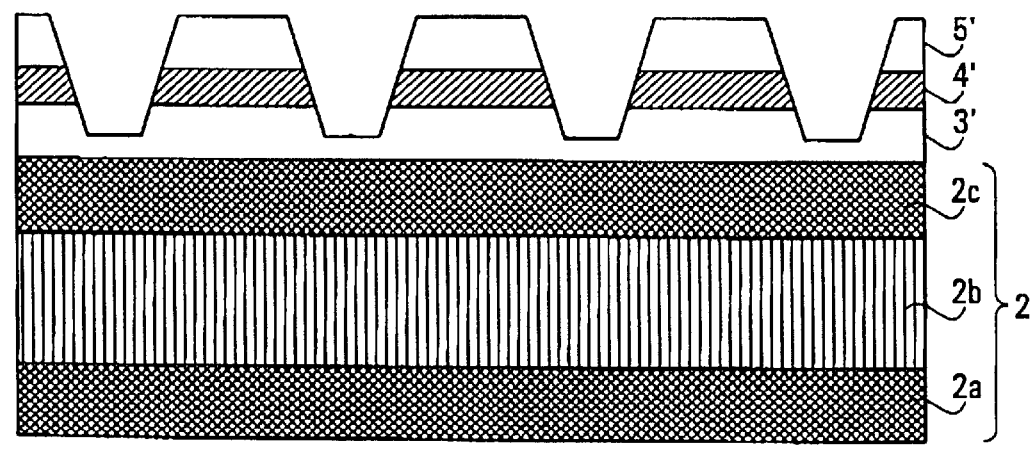
FIG. 4 depicts the structure of FIG. 3 after the photoresist grating mask has been removed with a suitable stripping solvent.

The photoresist mask 6 is then stripped using a suitable stripping solvent to produce the structure shown in FIG. 4. The photoresist mask 6 may also be stripped with, for example, an oxygen plasma in a reactive ion etching process. In any case, after the iodic acid etch and photoresist strip, a grating pattern is observed. As is seen, the multi-layers structure comprising the grating pattern now consists of a residual upper InP layer 5', a residual etch-stop layer 4' and a residual lower InP layer 3'.

Figure 5:
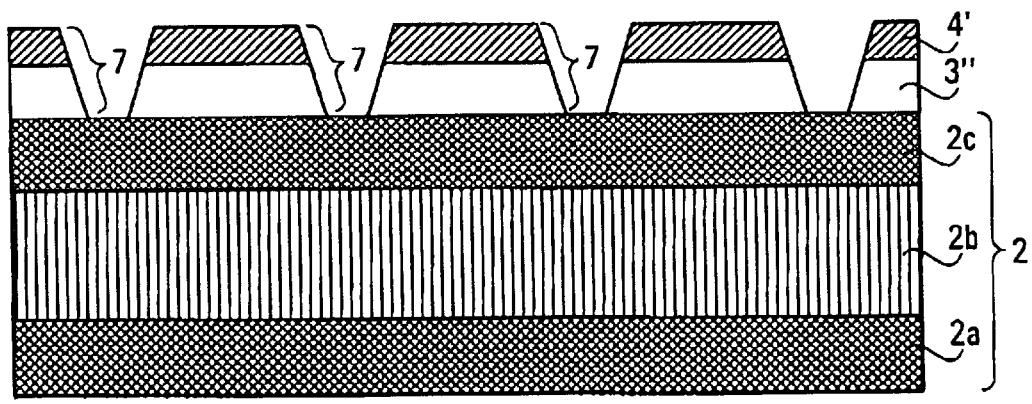
FIG. 5 illustrates the structure of FIG. 4 after having been subjected to a selective etch to remove any exposed InP material.

The residual lower and upper InP material 3' and 5' exposed at the surface of the structure in FIG. 4 is subsequently etched away with a chemistry that does not etch quaternary e.g. a solution comprising 2 HCl:3 H3PO4.The HCL:H3PO4 etchant used here is selective and removes only the 'unmasked' InP material stopping at the quaternary stacked guiding region 2c. The residual upper InP layer 5' is thereby completely removed. However, as shown in FIG. 5, the residual etch-stop layer 4' preserves the desired grating pattern in a remaining lower InP layer 3".

Accordingly, the remaining lower InP layer 3" and residual etch-stop layer 4' comprise an InP grating mask 7 ready for the final "blitz-etching" stage. In other words, the InP grating mask 7 has the residual quaternary 4' from the original etch-stop layer 4 as its top layer and becomes the final mask defining the desired pattern to be etched into the active region 2b. Advantageously, this first stage of the method of the present invention yields a most reproducible InP grating mask.

As an example of the layer thicknesses involved in creating the InP grating mask 7 in accordance with the method of the present invention, the upper InP layer 5 might, for example, be approximately 20 nm, the etch-stop layer 4 approximately 4 nm and the lower InP layer 3 approximately 35 nm. Furthermore, a good InP grating mask will generally be defined by the following features: the bottom of the grating will be flat and wide and the grating will be uniform from wafer center to wafer edge. Using the particular example of the layer thicknesses cited above, then, the distance between the top of the InP grating tooth and the flat bottom of the grating should be approximately 39 nm (35 nm of lower InP+4 nm of etch-stop).

The final stage of the method of the present invention is the "blitz-etch" whereby the InP grating mask 7 is used as a mask for an etch into the active region 2b of the device. The blitz-etch is a wet etch in 1 $HBr:1HNO_{3:18}$ $H_2O$, for example. The exact ratio of components in the wet etch chemistry is not critical. For example, the chemistry could be more or less dilute. Similarly, the ratio of HBr to $HNO_3$ could be different. Although the $HBr:HNO_3$ acid does etch InP, it etches quaternary material far more aggressively and, for reasonable etch times, the remaining lower InP layer 3" may be considered as a mask for the active region 2b. Other etchants could be used for the blitz-etching stage as long as they etch quaternary as fast as or faster than InP. For example, iodic acid is one such alternative.

Figure 6:
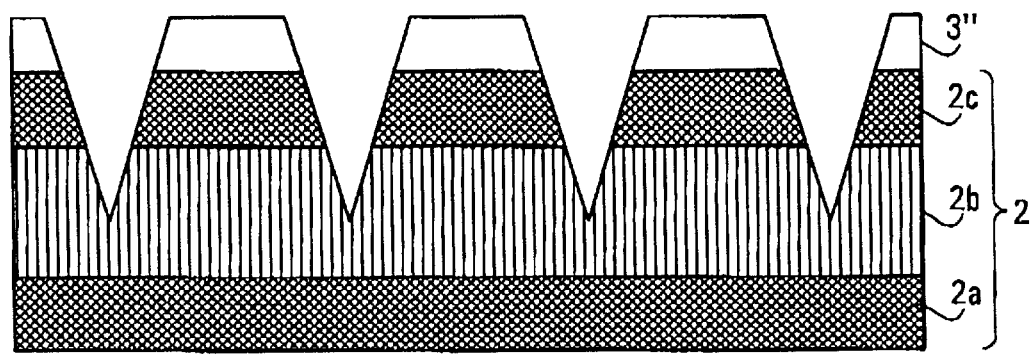
FIG. 6 depicts the final grating structure after blitz-etching whereby the grating pattern has been transferred to the semiconductor structure.

FIG. 6, then, shows the final grating structure after blitz-etching whereby the grating pattern has been transferred to the active region 2b of the semiconductor structure 2. The residual etch-stop layer 4' of the InP grating mask 7 is absent as it is etched away very quickly since it is a very thin, high-wavelength quaternary (Q) material. The remaining lower InP layer 3" remains because, as mentioned, it etches very slowly compared to quaternary materials.

In principle, some etching of the remaining InP layer 3" comprising the InP grating mask 7 will occur during the final blitz-etching stage. In practice, however, the etching of this material is so slow that the mask thickness may, for all intents and purposes, be considered to remain constant (e.g. approximately 35 nm if using the example thicknesses cited earlier). As mentioned above, the residual 1.25 Q etch-stop layer 4' etches very quickly in the blitz-etch and may be assumed to be completely removed.

Upon completion of the final blitz-etching stage, the remaining lower InP material 3" comprising the InP grating mask 7 may be removed or left on for subsequent processing. For example, this material may be left intact to protect the grating during a pre-MOCVD clean (etch) prior to, say, a subsequent $2^{nd}$ growth stage.

The etching method of the present invention has been specifically designed to achieve shallow gain-coupled gratings of 2–3 quantum well depth. The process is particularly suitable for use in any 1.3 micron or 1.55 micron photoluminescence (PL) active region, with or without a quaternary stack guiding region (i.e. the 1.10 Q, 1.55 Q, and 1.20 Q layers), by adding to the active region the three layers (i.e. InP/etch-stop/InP) which are used to define an InP grating mask.

The InP grating mask will typically reside on top of a quaternary stack guiding region as illustrated in FIG. 5. The grating is subsequently etched through the quaternary stack guiding region and into the active region to produce a gain-coupled grating. Although a structure etched in accordance with the invention has been described as having the quaternary stack guiding region 2c on top of the active region 2b, it should be noted that this is only an example embodiment and, in no way, should it limit the scope of the invention. For example, the method of the present invention also applies to structures where such a quaternary stack guiding region 2c is not present as well as to structures having uniform active regions (i.e. comprising a slab of single Q material).

Similarly, the method of the present invention is not limited to etching a grating pattern within a particular active region of a semiconductor structure. For example, the method of the present invention may also be employed in the fabrication of an index-coupled laser, whose grating pattern is usually etched into its quaternary stack guiding region. In such a case, the guiding region will typically be thicker than for a gain-coupled grating. The method of the present invention is particularly useful, however, when etching gain-coupled gratings because of the inherent difficulties in achieving good depth control and grating uniformity with such structures.

Advantageously, the method of the present invention offers great simplicity over conventional techniques since the InP grating mask is created without using an oxide mask. Furthermore, the method of the present invention has been specifically designed so that the HBr:HNO3 acid (or other suitable acid) directly attacks the quaternary during the final blitz-etch stage allowing an acid concentration to be chosen such that reasonable etch times may be realized for good reproducibility.

Most importantly, however, the etching process of the present invention produces uniform, shallow, gain-coupled gratings. With conventional etching techniques, a single etch is used to penetrate both the InP and the quaternary. Specifically, the HBr:HNO3 acid or any suitable alternative has to etch through slow etch-rate InP before reaching the high etch-rate quaternary, leading to very poor depth control. In extreme cases, some parts of the grating pattern may not enter the quaternary at all.

The etching process of the present invention offers a further significant advantage in that the active region is never exposed to photoresist or to any solvents used to strip the photoresist. In fact, all of the material exposed to the stripping solvent and photoresist is stripped off prior to blitz etching. In contrast, conventional techniques using a direct wet etch usually employ a photoresist mask when etching the active region. In such cases, when the photoresist is being stripped, the active region is unavoidably exposed to the stripping solvent and contaminants in the solvent. Likewise, if the photoresist is stripped using a dry etching process, the active region will be exposed to reactive plasma.

While preferred embodiments of the invention have been described and illustrated, it will be apparent to those skilled in the art that numerous modifications and variations are possible. The invention is intended to cover all such alternatives that fall within the scope of the claims appended hereto.

What is claimed is:

1. A method of etching a pattern in a semiconductor material comprising:
    forming an InP grating mask on said semiconductor material, said InP grating mask selectively exposing the semiconductor material and defining the pattern to be etched;
    etching the exposed semiconductor material so as to transfer the pattern to the semiconductor material wherein the step of forming the InP grating mask on the semiconductor material comprises:
        forming a multi-layered structure on said semiconductor material comprising a first InP layer, an etch-stop layer and a second InP layer;
        coating said second InP layer with photoresist;
        forming the pattern to be etched in the semiconductor material in said photoresist, thereby selectively exposing the multilayered structure;
        etching the second InP layer, the etch-stop layer and the first InP layer;
        removing the photoresist from the remaining second InP layer; and
        selectively etching the remaining first and second InP layers to selectively expose the semiconductor material and the remaining etch-stop layer, respectively.

2. A method according to claim 1, wherein the semiconductor material is a quaternary alloy.

3. A method according to claim 2 wherein said quaternary alloy is InGaAsP.

4. A method according to claim 1 wherein the pattern to be etched in the semiconductor material is a grating.

5. A method according to claim 4 wherein said grating is a periodic grating.

6. A method according to claim 1 wherein the pattern to be etched in the semiconductor material is a corrugation.

7. A method according to claim 1 wherein the multilayered structure is formed using metal organic chemical vapor deposition (MOCVD) techniques.

8. A method according to claim 1 wherein the multilayered structure is formed using molecular beam epitaxy (MBE) techniques.

9. A method according to claim 1 wherein the multilayered structure is formed using chemical beam epitaxy (CBE) techniques.

10. A method according to claim 1 wherein the multilayered structure is formed using liquid phase epitaxy (LPE) techniques.

11. A method according to claim 1 wherein the etch-stop layer is a InGaAsP quaternary.

12. A method according to claim 11 wherein the second InP layer, the etch-stop layer and the first InP layer is etched with iodic acid.

13. A method according to claim 11 wherein the second InP layer, the etch-stop layer and the first InP layer is etched with a solution of $HBr:HNO_3:H_2O$.

14. A method according to claim 1 wherein the photoresist is removed from the second InP layer using a suitable stripping solvent.

15. A method according to claim 1 wherein the photoresist is removed from the second InP layer using an oxygen plasma in a reactive ion etching process.

16. A method according to claim 1 wherein the remaining (residual) first and second InP layers are etched in a solution of $HCL:H_3PO_4$ to selectively expose the semiconductor material in accordance with the pattern to be etched.

17. A method according to claim 3 wherein the selectively exposed semiconductor material is etched in a $HBr:HNO_3$ acid.

18. A method according to claim 3 wherein the selectively exposed semiconductor material is etched in iodic acid.

19. A method of etching a pattern in a semiconductor material comprising:
    forming a multi-layered structure on the semiconductor material comprising a first InP layer, an etch-stop layer and a second InP layer;
    forming an InP grating mask from said multilayered structure on the semiconductor material, the InP grating mask selectively exposing the semiconductor material and defining the pattern to be etched; and
    etching the exposed semiconductor material so as to transfer the pattern to the semiconductor material.

20. A method according to claim 19 wherein the pattern to be etched in the semiconductor material is a grating.

21. A method according to claim 19 wherein the semiconductor material is a quaternary alloy.

22. A method according to claim 21 wherein said quaternary alloy is InGaAsP.

23. A method according to claim 20 wherein the grating is etched into an active region of the semiconductor material to achieve gain modulation in the semiconductor material.

24. A method according to claim 20 wherein the grating is etched into semiconductor material to achieve index modulation in the semiconductor material.

25. A method of controllably etching a grating pattern in a InGaAsP quarternary comprising:

growing a first InP layer on top of the InGaAsP quarternary;

growing an etch-stop layer on top of the first InP layer;

growing a second InP layer on top of the etch-stop layer;

coating the second InP layer with a photoresist;

forming a pattern in the photoresist, said pattern corresponding to the grating pattern to be etched into the InGaAsP quaternary;

etching the second InP layer, the etch-stop layer and the first InP layer;

removing the photoresist from said second InP layer;

etching the remaining first and second InP layers to selectively expose the InGaAsP quarternary and the etch-stop layer;

etching the exposed InGaAsP quarternary so as to transfer the grating pattern to the InGaAsP quarternary.

\* \* \* \* \*